US008531043B2

(12) United States Patent
Ha et al.

(10) Patent No.: US 8,531,043 B2
(45) Date of Patent: Sep. 10, 2013

(54) PLANAR ENCAPSULATION AND MOLD CAVITY PACKAGE IN PACKAGE SYSTEM

(75) Inventors: Jong-Woo Ha, Seoul (KR); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 431 days.

(21) Appl. No.: 12/236,445

(22) Filed: Sep. 23, 2008

(65) Prior Publication Data

US 2010/0072634 A1  Mar. 25, 2010

(51) Int. Cl.
*H01L 23/28* (2006.01)
*H01L 21/00* (2006.01)

(52) U.S. Cl.
USPC .......... 257/787; 257/685; 257/686; 257/698; 257/723; 257/788; 257/790; 438/127

(58) Field of Classification Search
USPC ................. 257/685, 686, 723, 757, 788, 790
See application file for complete search history.

(56) References Cited

U.S. PATENT DOCUMENTS

| 7,279,786 | B2* | 10/2007 | Kim | 257/686 |
| 7,309,913 | B2* | 12/2007 | Shim et al. | 257/686 |
| 7,528,474 | B2* | 5/2009 | Lee | 257/686 |
| 7,709,944 | B2* | 5/2010 | Kuan et al. | 257/686 |
| 7,732,254 | B2* | 6/2010 | Karnezos | 438/108 |
| 7,851,900 | B2* | 12/2010 | Ohsaka et al. | 257/686 |
| 2008/0042251 | A1* | 2/2008 | Weng et al. | 257/686 |

* cited by examiner

*Primary Examiner* — Matthew W Such
*Assistant Examiner* — David Spalla
(74) *Attorney, Agent, or Firm* — Ishimaru & Associates LLP

(57) ABSTRACT

An integrated circuit package system includes: providing a substrate; mounting a first package above the substrate, the first package having a mold cavity exposing an exposed portion on a first integrated circuit from a first package encapsulation; mounting a second package above the first package and attached to the exposed portion of the first integrated circuit; mounting a structure above the second package and connected to the substrate around the first package; and encapsulating the first package and the second package with an outer encapsulation having a completely planar top or a planar top co-planar to a top surface of the structure.

18 Claims, 7 Drawing Sheets

PLANAR ENCAPSULATION AND MOLD CAVITY PACKAGE IN PACKAGE SYSTEM

TECHNICAL FIELD

The present invention relates generally to integrated circuits and more particularly to a system for utilizing a planar encapsulation and a mold cavity in a package on package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies is not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses, and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing a substrate; mounting a first package above the substrate, the first package having a mold cavity exposing an exposed portion on a first integrated circuit from a first package encapsulation; mounting a second package above the first package and attached to the exposed portion of the first integrated circuit; mounting a structure above the second package and connected to the substrate around the first package; and encapsulating the first package and the second package with an outer encapsulation having a completely planar top or a planar top co-planar to a top surface of the structure.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
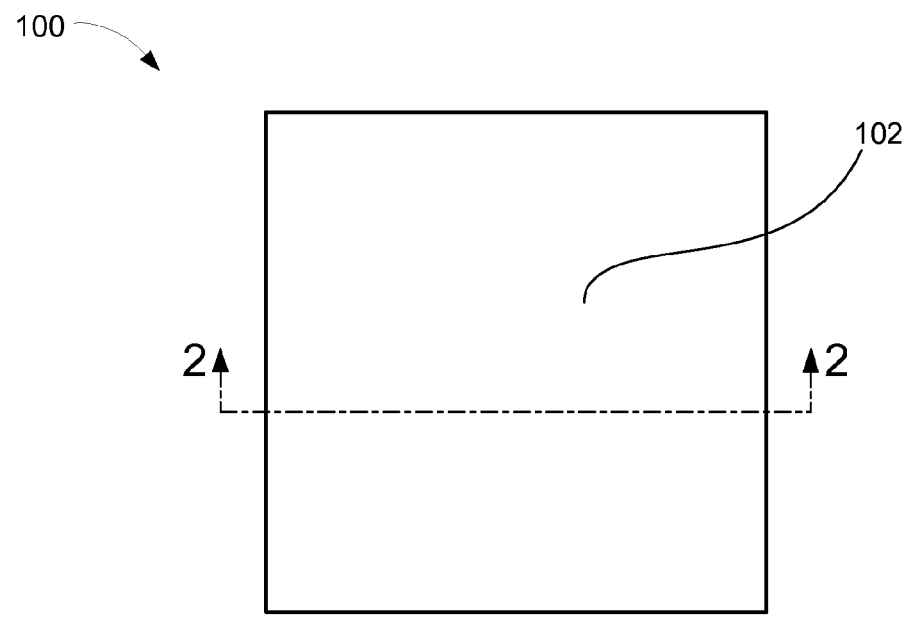
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having an outer encapsulation 102 such as a film assisted molding.

Figure 2:
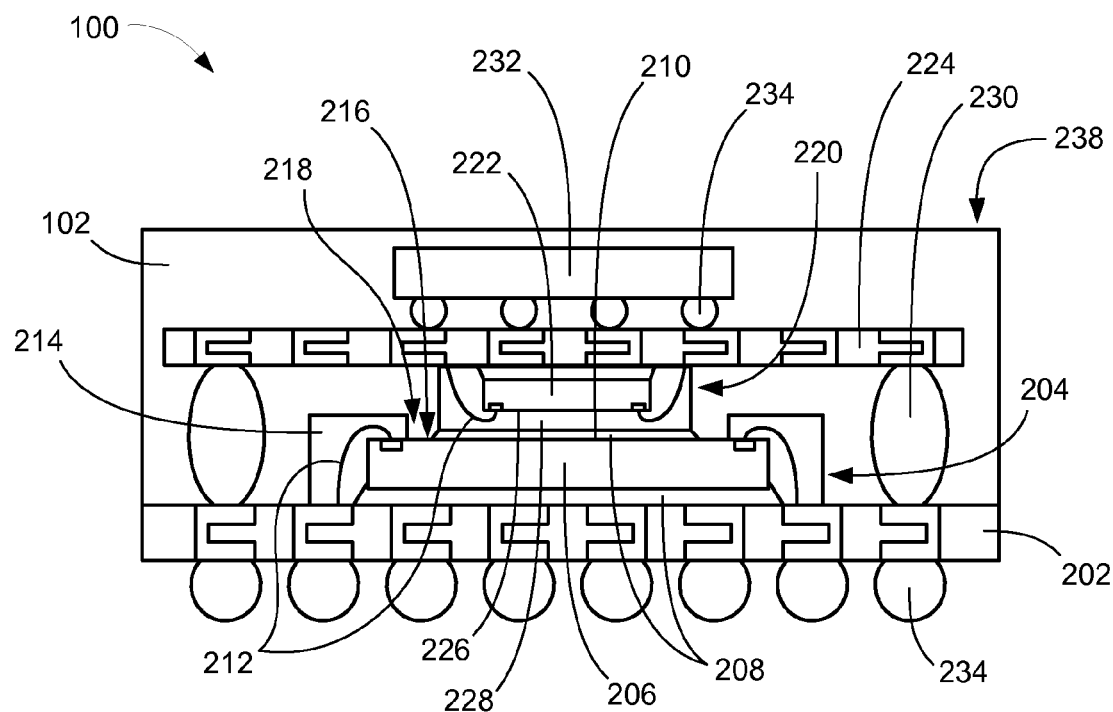
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having a substrate 202 such as a laminated plastic or ceramic substrate.

Mounted above the substrate 202 is a first package 204. The first package 204 has a first integrated circuit 206 such as a wire-bonded die attached to the substrate 202 with a die attach adhesive 208.

The first integrated circuit 206 has an active side 210 connected to the substrate 202 with an interconnection such as bond wires 212. A first package encapsulation 214 encapsulates the bond wires 212 and partially encapsulates the first integrated circuit 206 leaving an exposed portion 216 of the active side 210 exposed.

The first package 204 has a mold cavity 218 created in the first package encapsulation 214 where the exposed portion 216 of the first integrated circuit 206 is exposed from the first package encapsulation 214.

Mounted above the first package 204 is a second package 220 inverted and attached to the exposed portion 216 of the first integrated circuit 206 with the die attach adhesive 208. The second package 220 has a second integrated circuit 222 such as a wire-bonded die attached to a structure such as an interposer 224 with the die attach adhesive 208.

It has been discovered that the mold cavity 218 reduces total package height by allowing the second package 220 to be mounted directly to the first integrated circuit 206.

An active side 226 of the second integrated circuit 222 is connected to the interposer 224 with the bond wires 212. A second package encapsulation 228 encapsulates the bond wires 212 connecting the active side 226 of the second integrated circuit 222 to the interposer 224.

The interposer 224 of the second package 220 extends horizontally beyond the first package 204 and is connected to the substrate 202 with internal interconnects 230 such as solder pillars from under the interposer 224 and around the first package 204. Above the second package 220 a third package 232 is mounted and connected to the interposer 224 with an interconnect such as solder bumps 234.

The third package 232, the second package 220, and the first package 204 are encapsulated over the substrate 202 by the outer encapsulation 102 with a completely planar top 238. Mounted below the substrate 202 are the solder bumps 234.

It has been discovered that the completely planar top 238 of the outer encapsulation 102 allows for a streamlined encapsulation that does not require a "top chase" dedicated to create the outer encapsulation 102, thus reducing process complexity and cost.

Figure 3:
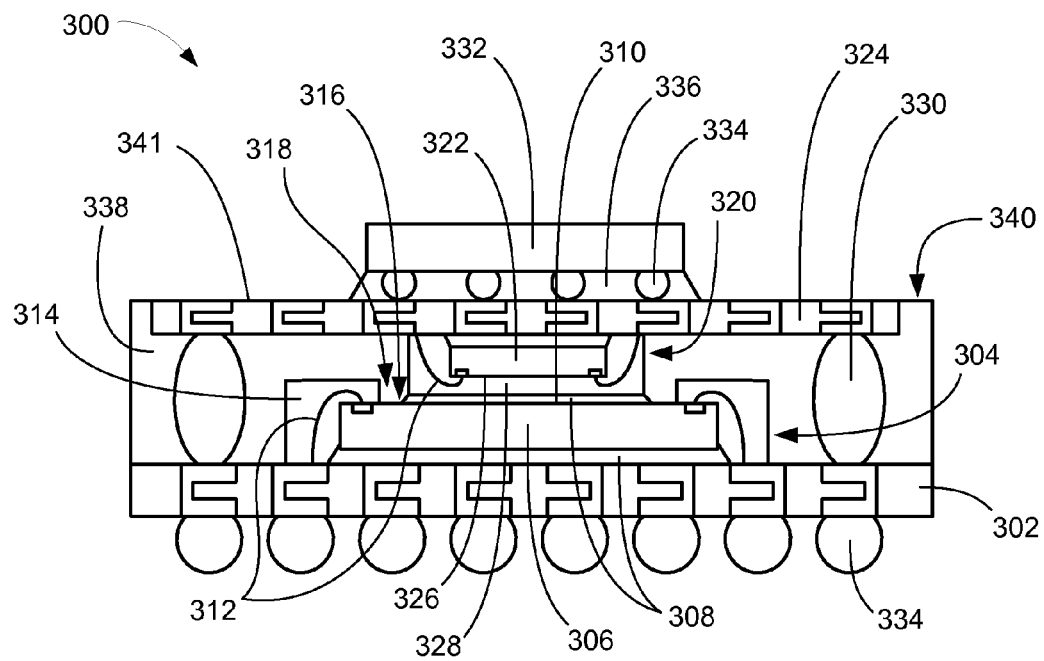
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 is shown having a substrate 302 such as a laminated plastic or ceramic substrate.

Mounted above the substrate 302 is a first package 304. The first package 304 has a first integrated circuit 306 such as a wire-bonded die attached to the substrate 302 with a die attach adhesive 308.

The first integrated circuit 306 has an active side 310 connected to the substrate 302 with an interconnection such as bond wires 312. A first package encapsulation 314 encapsulates the bond wires 312 and partially encapsulates the first integrated circuit 306 leaving an exposed portion 316 of the active side 310 exposed.

The first package 304 has a mold cavity 318 created in the first package encapsulation 314 where the exposed portion 316 of the first integrated circuit 306 is exposed from the first package encapsulation 314.

Mounted above the first package 304 is a second package 320 inverted and attached to the exposed portion 316 of the first integrated circuit 306 with the die attach adhesive 308. The second package 320 has a second integrated circuit 322 such as a wire-bonded die attached to a structure such as an interposer 324 with the die attach adhesive 308.

It has been discovered that the mold cavity 318 reduces total package height by allowing the second package 320 to be mounted directly to the first integrated circuit 306.

An active side 326 of the second integrated circuit 322 is connected to the interposer 324 with the bond wires 312. A second package encapsulation 328 encapsulates the bond wires 312 connecting the active side 326 of the second integrated circuit 322 to the interposer 324.

The interposer 324 of the second package 320 extends horizontally beyond the first package 304 and is connected to the substrate 302 with internal interconnects 330 such as solder pillars from under the interposer 324 and around the first package 304. Above the second package 320 a third package 332 is mounted and connected to the interposer 324 with an interconnect such as solder bumps 334.

Between the third package 332 and the interposer 324 is an under-fill 336 providing structural rigidity and isolation between the solder bumps 334 and the environment.

The second package 320 and the first package 304 are encapsulated over the substrate 302 by an outer encapsulation 338 with a planar top 340. Mounted below the substrate 302 are the solder bumps 334. The planar top 340 is co-planar to a top surface 341 of the interposer 324.

It has been discovered that the planar top 340 of the outer encapsulation 338 allows for a streamlined encapsulation that does not require a "top chase" dedicated to create the outer encapsulation 338, thus reducing process complexity and cost.

Figure 4:
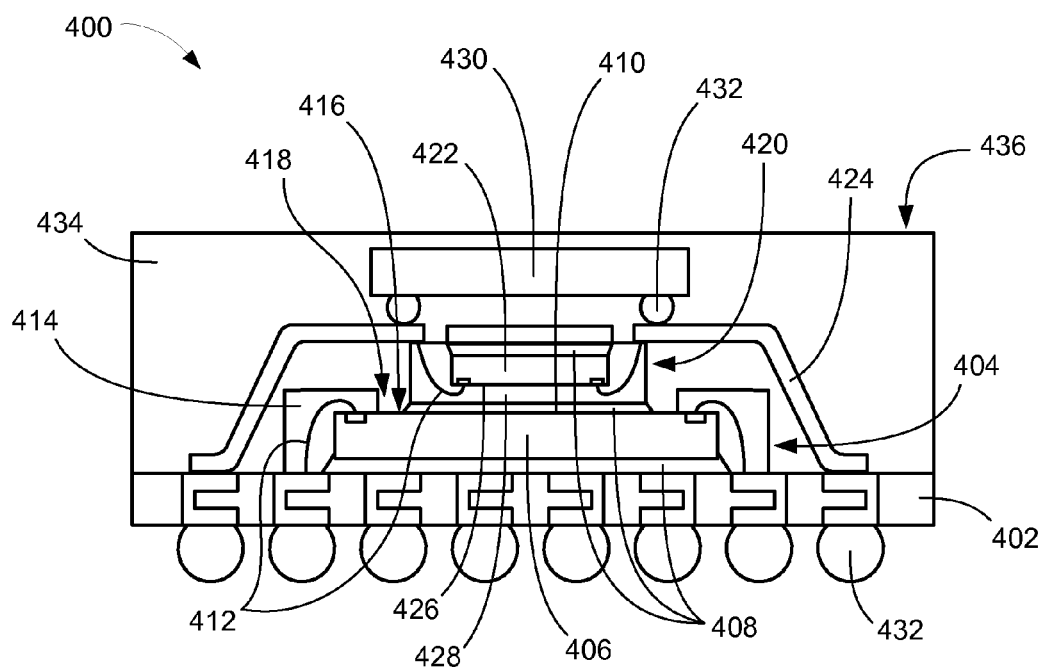
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 is shown having a substrate 402 such as a laminated plastic or ceramic substrate.

Mounted above the substrate 402 is a first package 404. The first package 404 has a first integrated circuit 406 such as a wire-bonded die attached to the substrate 402 with a die attach adhesive 408.

The first integrated circuit 406 has an active side 410 connected to the substrate 402 with an interconnection such as bond wires 412. A first package encapsulation 414 encapsulates the bond wires 412 and partially encapsulates the first integrated circuit 406 leaving an exposed portion 416 of the active side 410 exposed.

The first package 404 has a mold cavity 418 created in the first package encapsulation 414 where the exposed portion 416 of the first integrated circuit 406 is exposed from the first package encapsulation 414.

Mounted above the first package 404 is a second package 420 inverted and attached to the exposed portion 416 of the first integrated circuit 406 in the mold cavity 418 with the die attach adhesive 408. The second package 420 has a second integrated circuit 422 such as a wire-bonded die attached to the underside of a structure such as a lead frame 424 with the die attach adhesive 408.

It has been discovered that the mold cavity 418 reduces total package height by allowing the second package 420 to be mounted directly to the first integrated circuit 406.

An active side 426 of the second integrated circuit 422 is connected to the lead frame 424 with the bond wires 412. A second package encapsulation 428 encapsulates the second integrated circuit 422.

The lead frame 424 of the second package 420 extends horizontally beyond the first package 404 and is directly connected to the substrate 402 from under the lead frame 424 and extends from the substrate 402 vertically beyond the first package 404 and around the first package 404. Above the second package 420 a third package 430 is mounted and connected to the lead frame 424 with an interconnect such as solder bumps 432.

The third package 430, the second package 420, and the first package 404 are encapsulated over the substrate 402 and therebetween by an outer encapsulation 434 with a completely planar top 436 parallel to the substrate 402. Mounted below the substrate 402 are the solder bumps 432.

It has been discovered that the completely planar top 436 of the outer encapsulation 434 allows for a streamlined encapsulation that does not require a "top chase" dedicated to create the outer encapsulation 434, thus reducing process complexity and cost.

Figure 5:
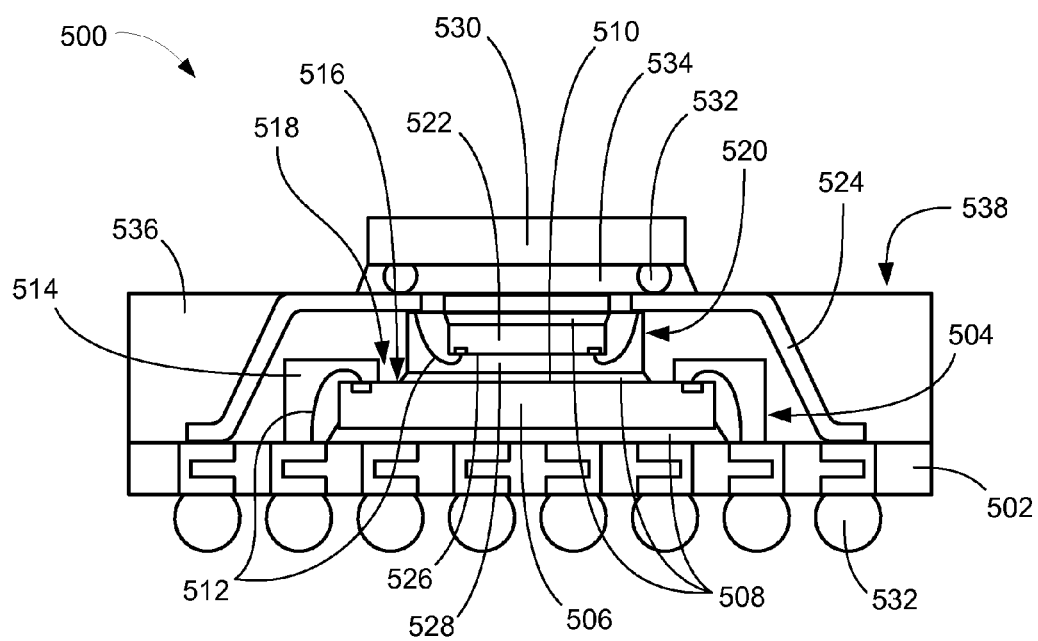
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 is shown having a substrate 502 such as a laminated plastic or ceramic substrate.

Mounted above the substrate 502 is a first package 504. The first package 504 has a first integrated circuit 506 such as a wire-bonded die attached to the substrate 502 with a die attach adhesive 508.

The first integrated circuit 506 has an active side 510 connected to the substrate 502 with an interconnection such as bond wires 512. A first package encapsulation 514 encapsulates the bond wires 512 and partially encapsulates the first integrated circuit 506 leaving an exposed portion 516 of the active side 510 exposed.

The first package 504 has a mold cavity 518 created in the first package encapsulation 514 where the exposed portion 516 of the first integrated circuit 506 is exposed from the first package encapsulation 514.

Mounted above the first package 504 is a second package 520 inverted and attached to the exposed portion 516 of the first integrated circuit 506 with the die attach adhesive 508. The second package 520 has a second integrated circuit 522 such as a wire-bonded die attached to a structure such as a lead frame 524 with the die attach adhesive 508.

It has been discovered that the mold cavity 518 reduces total package height by allowing the second package 520 to be mounted directly to the first integrated circuit 506.

An active side 526 of the second integrated circuit 522 is connected to the lead frame 524 with the bond wires 512. A second package encapsulation 528 encapsulates the second integrated circuit 522.

The lead frame 524 of the second package 520 extends horizontally beyond the first package 504 and is directly connected to the substrate 502 from under the lead frame 524 and extends from the substrate 502 vertically beyond the first package 504 and around the first package 504. Above the second package 520 a third package 530 is mounted and connected to the lead frame 524 with an interconnect such as solder bumps 532.

Between the third package 530 and the lead frame 524 is an under-fill 534 providing structural rigidity and isolation between the solder bumps 532 and the environment.

The second package 520 and the first package 504 are encapsulated over the substrate 502 and therebetween by an outer encapsulation 536 with a planar top 538. Mounted below the substrate 502 are the solder bumps 532. The planar top 538 is co-planar to a top surface of the lead frame 524.

It has been discovered that the planar top 538 of the outer encapsulation 536 allows for a streamlined encapsulation that does not require a "top chase" dedicated to create the outer encapsulation 536, thus reducing process complexity and cost.

Figure 6:
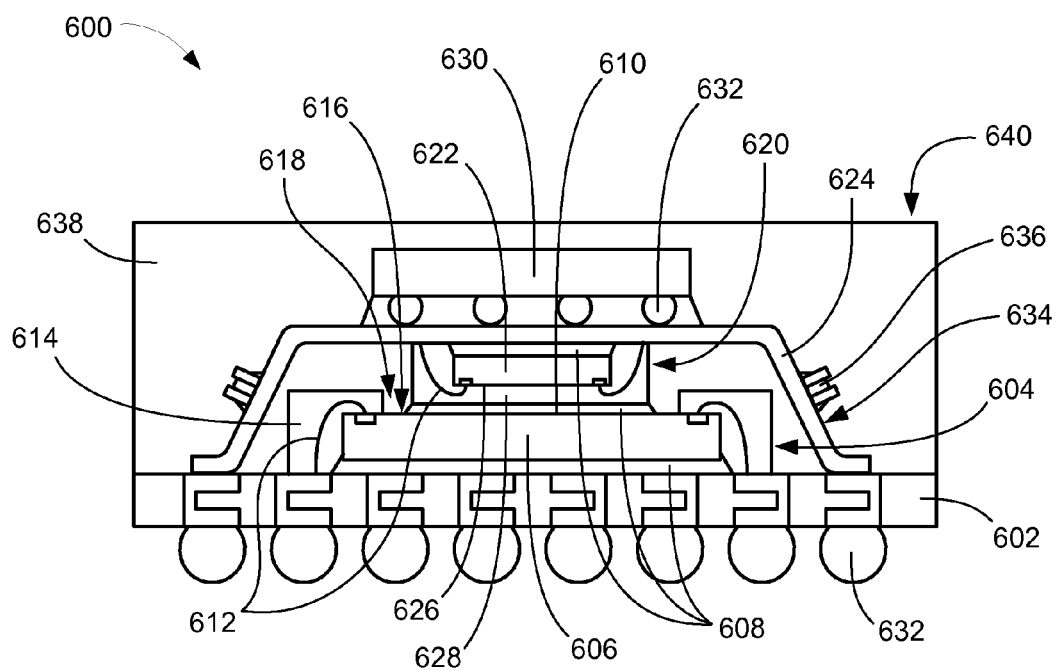
FIG. 6 is a cross-sectional view of an integrated circuit package system in a fifth embodiment of the present invention.

Referring now to FIG. 6, therein is shown a cross-sectional view of an integrated circuit package system 600 in a fifth embodiment of the present invention. The integrated circuit package system 600 is shown having a substrate 602 such as a laminated plastic or ceramic substrate.

Mounted above the substrate 602 is a first package 604. The first package 604 has a first integrated circuit 606 such as a wire-bonded die attached to the substrate 602 with a die attach adhesive 608.

The first integrated circuit 606 has an active side 610 connected to the substrate 602 with an interconnection such as bond wires 612. A first package encapsulation 614 encapsulates the bond wires 612 and partially encapsulates the first integrated circuit 606 leaving an exposed portion 616 of the active side 610 exposed.

The first package 604 has a mold cavity 618 created in the first package encapsulation 614 where the exposed portion 616 of the first integrated circuit 606 is exposed from the first package encapsulation 614.

Mounted above the first package 604 is a second package 620 inverted and attached to the exposed portion 616 of the first integrated circuit 606 with the die attach adhesive 608. The second package 620 has a second integrated circuit 622 such as a wire-bonded die attached to a structure such as a flexible interposer 624 such as a polyimide substrate with the die attach adhesive 608.

It has been discovered that the mold cavity 618 reduces total package height by allowing the second package 620 to be mounted directly to the first integrated circuit 606.

An active side 626 of the second integrated circuit 622 is connected to the flexible interposer 624 with the bond wires 612. A second package encapsulation 628 encapsulates the second integrated circuit 622.

The flexible interposer 624 of the second package 620 extends horizontally beyond the first package 604 and is directly connected to the substrate 602 from under the flexible interposer 624 and extends from the substrate 602 vertically beyond the first package 604 and around the first package 604. Above the second package 620 a third package 630 is mounted and connected to the flexible interposer 624 with an interconnect such as solder bumps 632.

Mounted along sides 634 of the flexible interposer 624 are passive components 636. The third package 630, the second package 620, and the first package 604 are encapsulated over the substrate 602 and therebetween by an outer encapsulation 638 with a completely planar top 640. Mounted below the substrate 602 are the solder bumps 632.

It has been discovered that the completely planar top 640 of the outer encapsulation 638 allows for a streamlined encapsulation that does not require a "top chase" dedicated to create the outer encapsulation 638, thus reducing process complexity and cost.

Figure 7:
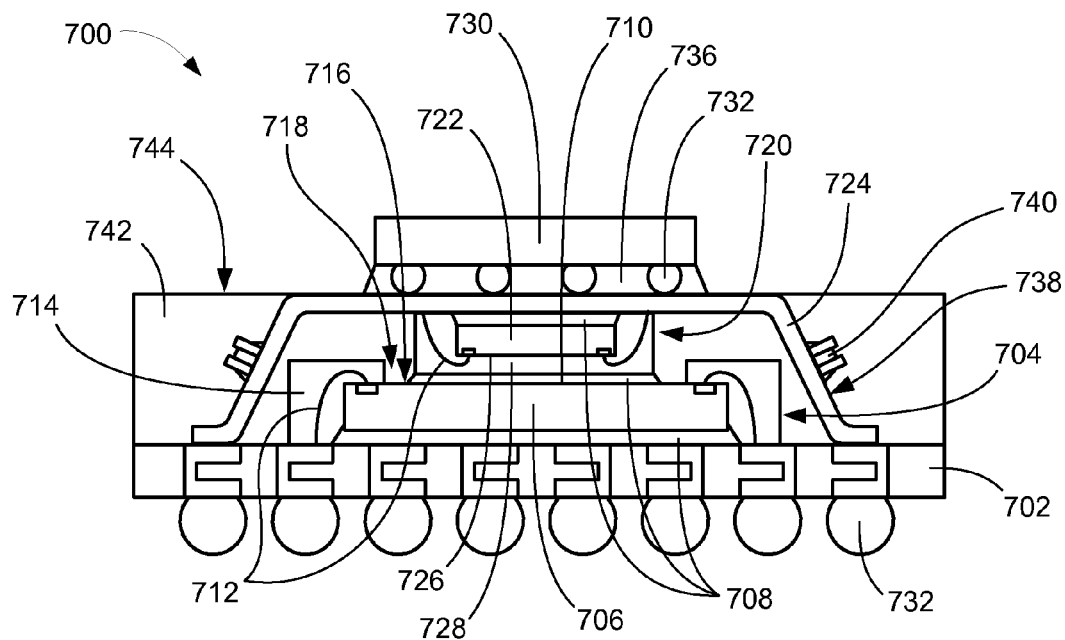
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 is shown having a substrate 702 such as a laminated plastic or ceramic substrate.

Mounted above the substrate 702 is a first package 704. The first package 704 has a first integrated circuit 706 such as a wire-bonded die attached to the substrate 702 with a die attach adhesive 708.

The first integrated circuit 706 has an active side 710 connected to the substrate 702 with an interconnection such as bond wires 712. A first package encapsulation 714 encapsulates the bond wires 712 and partially encapsulates the first integrated circuit 706 leaving an exposed portion 716 of the active side 710 exposed.

The first package 704 has a mold cavity 718 created in the first package encapsulation 714 where the exposed portion 716 of the first integrated circuit 706 is exposed from the first package encapsulation 714.

Mounted above the first package 704 is a second package 720 inverted and attached to the exposed portion 716 of the first integrated circuit 706 with the die attach adhesive 708. The second package 720 has a second integrated circuit 722 such as a wire-bonded die attached to a structure such as a flexible interposer 724 such as a polyimide substrate with the die attach adhesive 708.

It has been discovered that the mold cavity 718 reduces total package height by allowing the second package 720 to be mounted directly to the first integrated circuit 706.

An active side 726 of the second integrated circuit 722 is connected to the flexible interposer 724 with the bond wires 712. A second package encapsulation 728 encapsulates the second integrated circuit 722.

The flexible interposer 724 of the second package 720 extends horizontally beyond the first package 704 and is directly connected to the substrate 702 from under the flexible interposer 724 and extends from the substrate 702 vertically beyond the first package 704 and around the first package 704. Above the second package 720 a third package 730 is mounted and connected to the flexible interposer 724 with an interconnect such as solder bumps 732.

Between the third package 730 and the flexible interposer 724 is an under-fill 736 providing structural rigidity and isolation between the solder bumps 732 and the environment. Mounted along sides 738 of the flexible interposer 724 are passive components 740.

The second package 720 and the first package 704 are encapsulated over the Isubstrate 702 and therebetween by an outer encapsulation 742 with a planar top 744. Mounted below the substrate 702 are the solder bumps 732.

It has been discovered that the planar top 744 of the outer encapsulation 742 allows for a streamlined encapsulation that does not require a "top chase" dedicated to create the outer encapsulation 742, thus reducing process complexity and cost.

Figure 8:
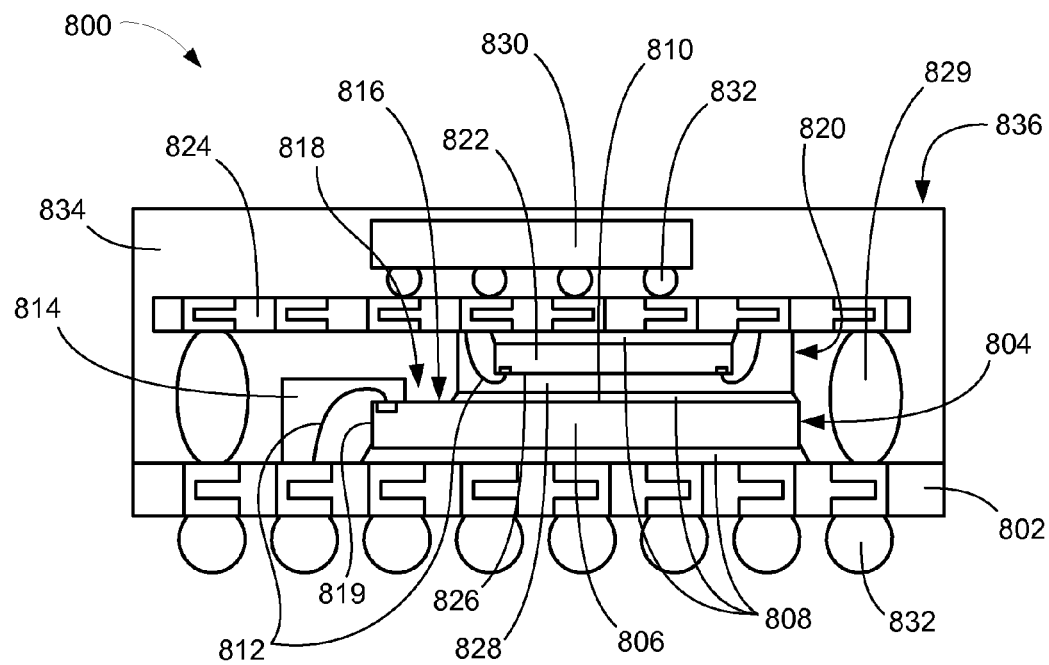
FIG. 8 is a cross-sectional view of an integrated circuit package system in a seventh embodiment of the present invention.

Referring now to FIG. 8, therein is shown a cross-sectional view of an integrated circuit package system 800 in a seventh embodiment of the present invention. The integrated circuit package system 800 is shown having a substrate 802 such as a laminated plastic or ceramic substrate.

Mounted above the substrate 802 is a first package 804. The first package 804 has a first integrated circuit 806 such as a wire-bonded die attached to the substrate 802 with a die attach adhesive 808.

The first integrated circuit 806 has an active side 810 connected to the substrate 802 with an interconnection such as bond wires 812. A first package encapsulation 814 encapsulates the bond wires 812 and partially encapsulates the first integrated circuit 806 leaving an exposed portion 816 of the active side 810 exposed.

The first package 804 has a mold cavity 818 offset to a side 819 of the first integrated circuit 806 created in the first package encapsulation 814 where the exposed portion 816 of the first integrated circuit 806 is exposed from the first package encapsulation 814.

Mounted above the first package 804 is a second package 820 inverted and attached to the exposed portion 816 of the first integrated circuit 806 with the die attach adhesive 808. The second package 820 has a second integrated circuit 822 such as a wire-bonded die attached to a structure such as an interposer 824 with the die attach adhesive 808.

It has been discovered that the mold cavity 818 reduces total package height by allowing the second package 820 to be mounted directly to the first integrated circuit 806.

An active side 826 of the second integrated circuit 822 is connected to the interposer 824 with the bond wires 812. A second package encapsulation 828 encapsulates the second integrated circuit 822.

The interposer 824 of the second package 820 extends horizontally beyond the first package 804 and is connected to the substrate 802 with internal interconnects 829 such as solder pillars from under the interposer 824 and around the first package 804. Above the second package 820 a third package 830 is mounted and connected to the interposer 824 with an interconnect such as solder bumps 832.

The third package 830, the second package 820, and the first package 804 are encapsulated over the substrate 802 by an outer encapsulation 834 with a completely planar top 836. Mounted below the substrate 802 are the solder bumps 832.

It has been discovered that the completely planar top 836 of the outer encapsulation 834 allows for a streamlined encapsulation that does not require a "top chase" dedicated to create the outer encapsulation 834, thus reducing process complexity and cost.

Figure 9:
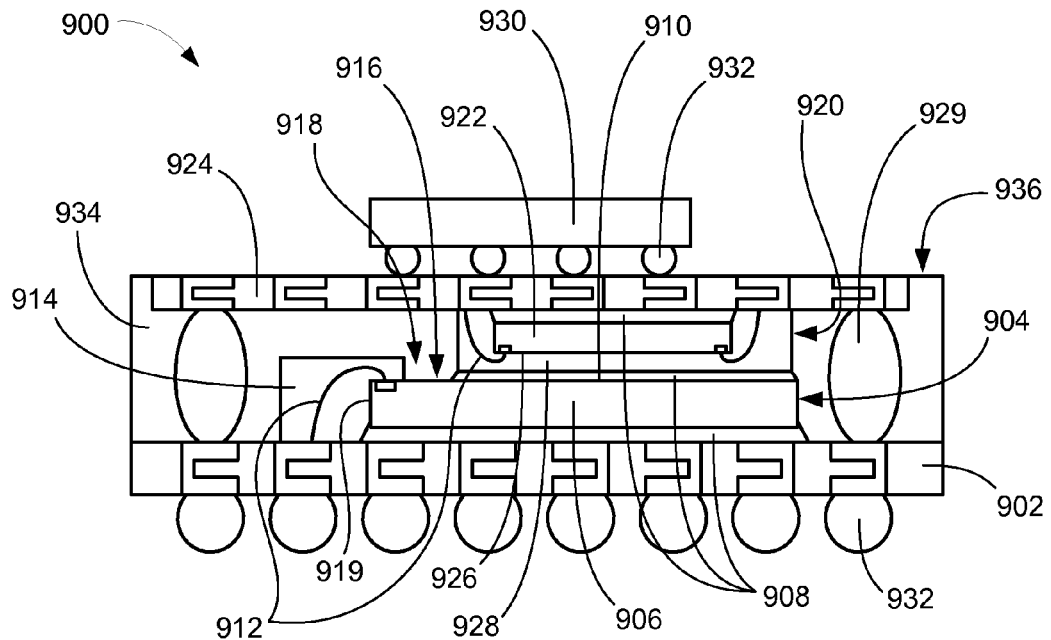
FIG. 9 is a cross-sectional view of an integrated circuit package system in an eighth embodiment of the present invention.

Referring now to FIG. 9, therein is shown a cross-sectional view of an integrated circuit package system 900 in an eighth embodiment of the present invention. The integrated circuit package system 900 is shown having a substrate 902 such as a laminated plastic or ceramic substrate.

Mounted above the substrate 902 is a first package 904. The first package 904 has a first integrated circuit 906 such as a wire-bonded die attached to the substrate 902 with a die attach adhesive 908.

The first integrated circuit 906 has an active side 910 connected to the substrate 902 with an interconnection such as bond wires 912. A first package encapsulation 914 encapsulates the bond wires 912 and partially encapsulates the first integrated circuit 906 leaving an exposed portion 916 of the active side 910 exposed.

The first package 904 has a mold cavity 918 offset to a side 919 of the first integrated circuit 906 created in the first package encapsulation 914 where the exposed portion 916 of the first integrated circuit 906 is exposed from the first package encapsulation 914.

Mounted above the first package 904 is a second package 920 inverted and attached to the exposed portion 916 of the first integrated circuit 906 with the die attach adhesive 908. The second package 920 has a second integrated circuit 922 such as a wire-bonded die attached to a structure such as an interposer 924 with the die attach adhesive 908.

It has been discovered that the mold cavity 918 reduces total package height by allowing the second package 920 to be mounted directly to the first integrated circuit 906.

An active side 926 of the second integrated circuit 922 is connected to the interposer 924 with the bond wires 912. A second package encapsulation 928 encapsulates the second integrated circuit 922.

The interposer 924 of the second package 920 extends horizontally beyond the first package 904 and is connected to the substrate 902 with internal interconnects 929 such as solder pillars from under the interposer 924 and around the first package 904. Above the second package 920 a third package 930 is mounted and connected to the interposer 924 with an interconnect such as solder bumps 932.

The second package 920 and the first package 904 are encapsulated over the substrate 902 by an outer encapsulation 934 with a planar top 936. Mounted below the substrate 902 are the solder bumps 932.

It has been discovered that the planar top 936 of the outer encapsulation 934 allows for a streamlined encapsulation that does not require a "top chase" dedicated to create the outer encapsulation 934, thus reducing process complexity and cost.

Figure 10:
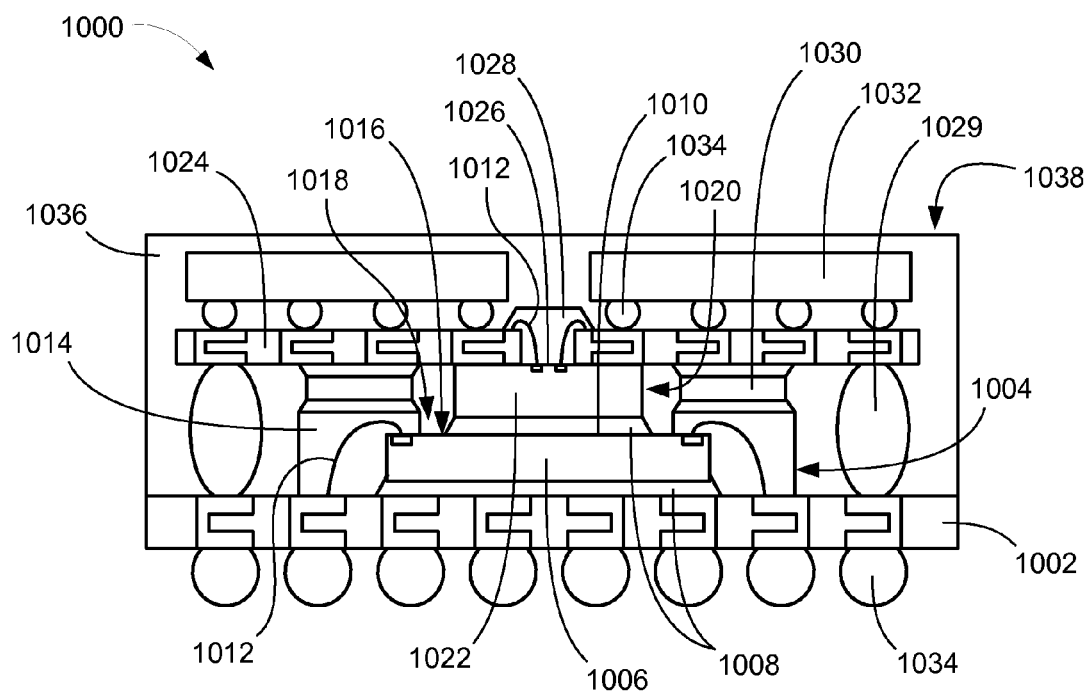
FIG. 10 is a cross-sectional view of an integrated circuit package system in a ninth embodiment of the present invention.

Referring now to FIG. 10, therein is shown a cross-sectional view of an integrated circuit package system 1000 in a ninth embodiment of the present invention. The integrated circuit package system 1000 is shown having a substrate 1002 such as a laminated plastic or ceramic substrate.

Mounted above the substrate 1002 is a first package 1004. The first package 1004 has a first integrated circuit 1006 such as a wire-bonded die attached to the substrate 1002 with a die attach adhesive 1008.

The first integrated circuit 1006 has an active side 1010 connected to the substrate 1002 with an interconnection such as bond wires 1012. A first package encapsulation 1014 encapsulates the bond wires 1012 and partially encapsulates the first integrated circuit 1006 leaving an exposed portion 1016 of the active side 1010 exposed.

The first package 1004 has a mold cavity 1018 created in the first package encapsulation 1014 where the exposed portion 1016 of the first integrated circuit 1006 is exposed from the first package encapsulation 1014.

Mounted above the first package 1004 is a second package 1020 inverted and attached to the exposed portion 1016 of the first integrated circuit 1006 with the die attach adhesive 1008. The second package 1020 has a second integrated circuit 1022 such as a wire-bonded die attached to a structure such as a multi-sectioned interposer 1024.

It has been discovered that the mold cavity 1018 reduces total package height by allowing the second package 1020 to be mounted directly to the first integrated circuit 1006.

An active side 1026 of the second integrated circuit 1022 is connected to the multi-sectioned interposer 1024 with the bond wires 1012. A second package encapsulation 1028 encapsulates the bond wires 1012 connecting the active side 1026 of the second integrated circuit 1022 to the multi-sectioned interposer 1024.

The multi-sectioned interposer 1024 of the second package 1020 extends horizontally beyond the first package 1004 and is connected to the substrate 1002 with internal interconnects 1029 such as solder pillars from under the multi-sectioned interposer 1024 and around the first package 1004.

Between the multi-sectioned interposer 1024 and the first package encapsulation 1014, internal supports 1030 are mounted. The internal supports 1030 add structural rigidity and help stabilize the multi-sectioned interposer 1024 during process.

Above the second package 1020 multiple upper packages 1032 are mounted and connected to the multi-sectioned interposer 1024 with an interconnect such as solder bumps 1034.

The multiple upper packages 1032, the second package 1020, and the first package 1004 are encapsulated over the substrate 1002 by an outer encapsulation 1036 with a completely planar top 1038. Mounted below the substrate 1002 are the solder bumps 1034.

It has been discovered that the completely planar top 1038 of the outer encapsulation 1036 allows for a streamlined encapsulation that does not require a "top chase" dedicated to create the outer encapsulation 1036, thus reducing process complexity and cost.

Figure 11:
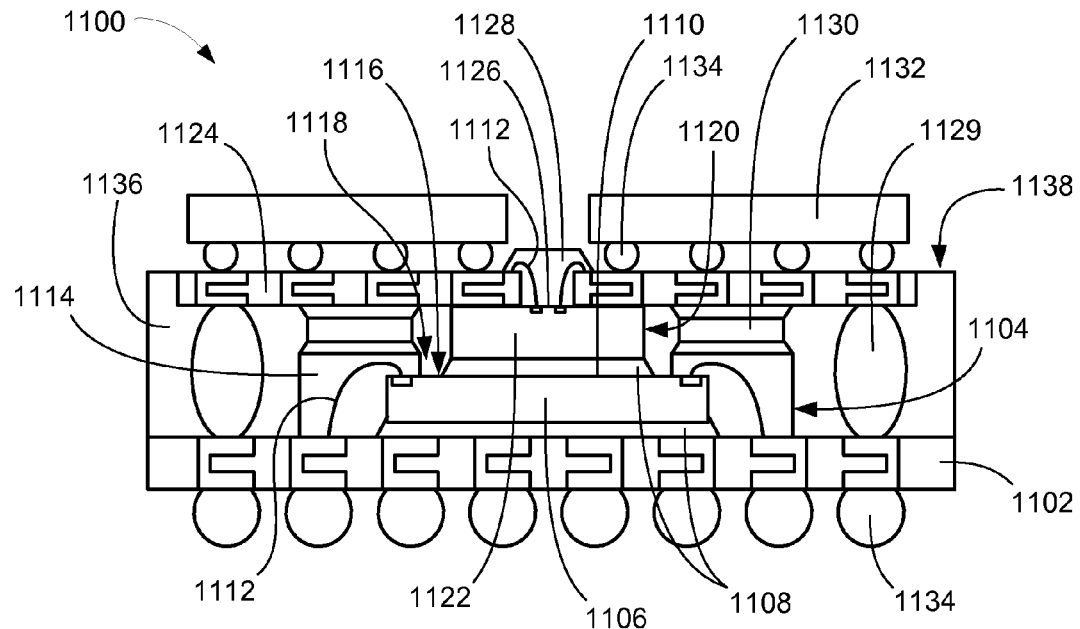
FIG. 11 is a cross-sectional view of an integrated circuit package system in a tenth embodiment of the present invention.

Referring now to FIG. 11, therein is shown a cross-sectional view of an integrated circuit package system 1100 in a tenth embodiment of the present invention. The integrated circuit package system 1100 is shown having a substrate 1102 such as a laminated plastic or ceramic substrate.

Mounted above the substrate 1102 is a first package 1104. The first package 1104 has a first integrated circuit 1106 such as a wire-bonded die attached to the substrate 1102 with a die attach adhesive 1108.

The first integrated circuit 1106 has an active side 1110 connected to the substrate 1102 with an interconnection such as bond wires 1112. A first package encapsulation 1114 encapsulates the bond wires 1112 and partially encapsulates the first integrated circuit 1106 leaving an exposed portion 1116 of the active side 1110 exposed.

The first package 1104 has a mold cavity 1118 created in the first package encapsulation 1114 where the exposed portion 1116 of the first integrated circuit 1106 is exposed from the first package encapsulation 1114.

Mounted above the first package 1104 is a second package 1120 inverted and attached to the exposed portion 1116 of the first integrated circuit 1106 with the die attach adhesive 1108. The second package 1120 has a second integrated circuit 1122 such as a wire-bonded die attached to a structure such as a multi-sectioned interposer 1124.

It has been discovered that the mold cavity 1118 reduces total package height by allowing the second package 1120 to be mounted directly to the first integrated circuit 1106.

An active side 1126 of the second integrated circuit 1122 is connected to the multi-sectioned interposer 1124 with the bond wires 1112. A second package encapsulation 1128 encapsulates the bond wires 1112 connecting the active side 1126 of the second integrated circuit 1122 to the multi-sectioned interposer 1124.

The multi-sectioned interposer 1124 of the second package 1120 extends horizontally beyond the first package 1104 and is connected to the substrate 1102 with internal interconnects 1129 such as solder pillars from under the multi-sectioned interposer 1124 and around the first package 1104.

Between the multi-sectioned interposer 1124 and the first package encapsulation 1114, internal supports 1130 are mounted. The internal supports 1130 add structural rigidity and help stabilize the multi-sectioned interposer 1124 during process.

Above the second package 1120 multiple upper packages 1132 are mounted and connected to the multi-sectioned interposer 1124 with an interconnect such as solder bumps 1134.

The second package 1120 and the first package 1104 are encapsulated over the substrate 1102 by an outer encapsulation 1136 with a planar top 1138. Mounted below the substrate 1102 are the solder bumps 1134.

It has been discovered that the planar top 1138 of the outer encapsulation 1136 allows for a streamlined encapsulation that does not require a "top chase" dedicated to create the outer encapsulation 1136, thus reducing process complexity and cost.

Figure 12:
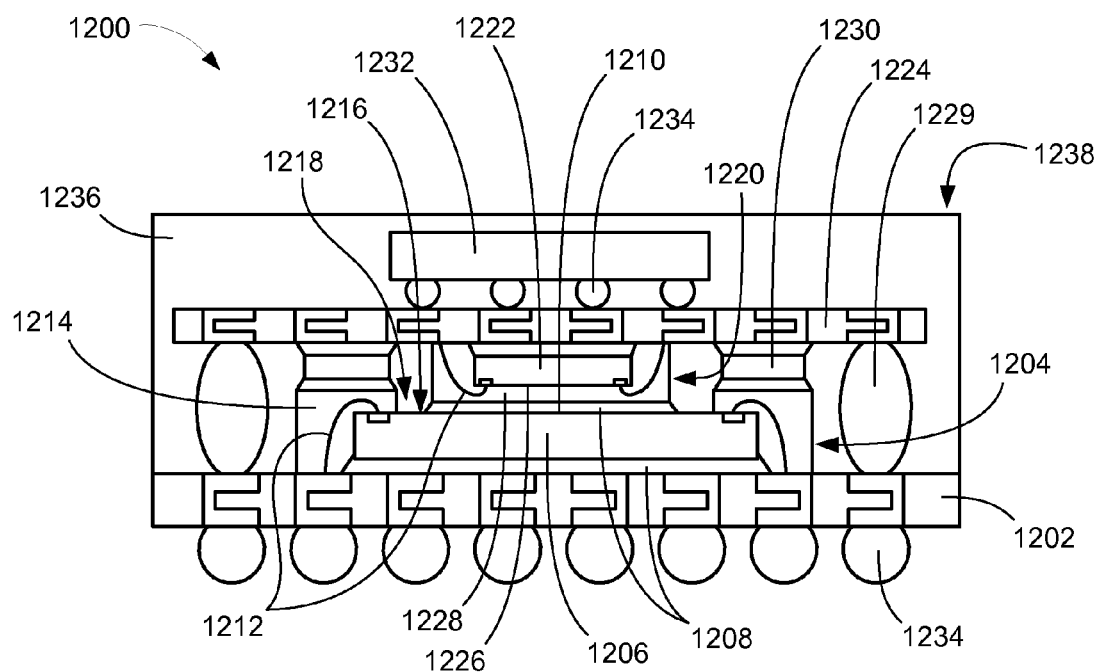
FIG. 12 is a cross-sectional view of an integrated circuit package system in an eleventh embodiment of the present invention.

Referring now to FIG. 12, therein is shown a cross-sectional view of an integrated circuit package system 1200 in an eleventh embodiment of the present invention. The integrated circuit package system 1200 is shown having a substrate 1202 such as a laminated plastic or ceramic substrate.

Mounted above the substrate 1202 is a first package 1204. The first package 1204 has a first integrated circuit 1206 such as a wire-bonded die attached to the substrate 1202 with a die attach adhesive 1208.

The first integrated circuit 1206 has an active side 1210 connected to the substrate 1202 with an interconnection such as bond wires 1212. A first package encapsulation 1214 encapsulates the bond wires 1212 and partially encapsulates the first integrated circuit 1206 leaving an exposed portion 1216 of the active side 1210 exposed.

The first package 1204 has a mold cavity 1218 created in the first package encapsulation 1214 where the exposed portion 1216 of the first integrated circuit 1206 is exposed from the first package encapsulation 1214.

Mounted above the first package 1204 is a second package 1220 inverted and attached to the exposed portion 1216 of the first integrated circuit 1206 with the die attach adhesive 1208. The second package 1220 has a second integrated circuit 1222 such as a wire-bonded die attached to a structure such as an interposer 1224.

It has been discovered that the mold cavity 1218 reduces total package height by allowing the second package 1220 to be mounted directly to the first integrated circuit 1206.

An active side 1226 of the second integrated circuit 1222 is connected to the interposer 1224 with the bond wires 1212. A second package encapsulation 1228 encapsulates the bond wires 1212 connecting the active side 1226 of the second integrated circuit 1222 to the interposer 1224.

The interposer 1224 of the second package 1220 extends horizontally beyond the first package 1204 and is connected to the substrate 1202 with internal interconnects 1229 such as solder pillars from under the interposer 1224 and around the first package 1204.

Between the interposer 1224 and the first package encapsulation 1214, internal supports 1230 are mounted. The internal supports 1230 add structural rigidity and help stabilize the interposer 1224 during process.

Above the second package 1220 a third package 1232 is mounted and connected to the interposer 1224 with an interconnect such as solder bumps 1234.

The third package 1232, the second package 1220, and the first package 1204 are encapsulated over the substrate 1202 by an outer encapsulation 1236 with a completely planar top 1238. Mounted below the substrate 1202 are the solder bumps 1234.

It has been discovered that the completely planar top 1238 of the outer encapsulation 1236 allows for a streamlined encapsulation that does not require a "top chase" dedicated to create the outer encapsulation 1236, thus reducing process complexity and cost.

Figure 13:
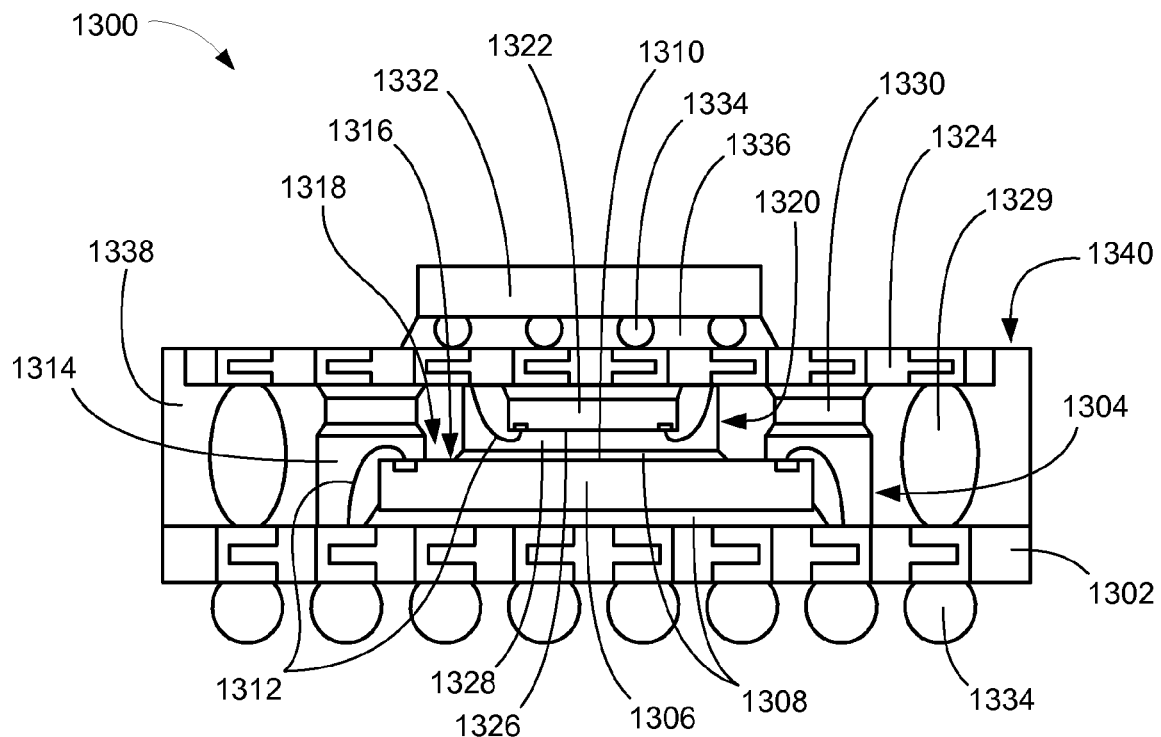
FIG. 13 is a cross-sectional view of an integrated circuit package system in a twelfth embodiment of the present invention.

Referring now to FIG. 13, therein is shown a cross-sectional view of an integrated circuit package system 1300 in a twelfth embodiment of the present invention. The integrated circuit package system 1300 is shown having a substrate 1302 such as a laminated plastic or ceramic substrate.

Mounted above the substrate 1302 is a first package 1304. The first package 1304 has a first integrated circuit 1306 such as a wire-bonded die attached to the substrate 1302 with a die attach adhesive 1308.

The first integrated circuit 1306 has an active side 1310 connected to the substrate 1302 with an interconnection such as bond wires 1312. A first package encapsulation 1314 encapsulates the bond wires 1312 and partially encapsulates the first integrated circuit 1306 leaving an exposed portion 1316 of the active side 1310 exposed.

The first package 1304 has a mold cavity 1318 created in the first package encapsulation 1314 where the exposed portion 1316 of the first integrated circuit 1306 is exposed from the first package encapsulation 1314.

Mounted above the first package 1304 is a second package 1320 inverted and attached to the exposed portion 1316 of the first integrated circuit 1306 with the die attach adhesive 1308. The second package 1320 has a second integrated circuit 1322 such as a wire-bonded die attached to a structure such as an interposer 1324.

It has been discovered that the mold cavity 1318 reduces total package height by allowing the second package 1320 to be mounted directly to the first integrated circuit 1306.

An active side 1326 of the second integrated circuit 1322 is connected to the interposer 1324 with the bond wires 1312. A second package encapsulation 1328 encapsulates the bond wires 1312 connecting the active side 1326 of the second integrated circuit 1322 to the interposer 1324.

The interposer 1324 of the second package 1320 extends horizontally beyond the first package 1304 and is connected to the substrate 1302 with internal interconnects 1329 such as solder pillars from under the interposer 1324 and around the first package 1304.

Between the interposer 1324 and the first package encapsulation 1314, internal supports 1330 are mounted. The internal supports 1330 add structural rigidity and help stabilize the interposer 1324 during process.

Above the second package 1320 a third package 1332 is mounted and connected to the interposer 1324 with an interconnect such as solder bumps 1334.

Between the third package 1332 and the interposer 1324 is an under-fill 1336 providing structural rigidity and isolation between the solder bumps 1334 and the environment.

The second package 1320 and the first package 1304 are encapsulated over the substrate 1302 by an outer encapsulation 1338 with a planar top 1340. Mounted below the substrate 1302 are the solder bumps 1334.

It has been discovered that the planar top 1340 of the outer encapsulation 1338 allows for a streamlined encapsulation that does not require a "top chase" dedicated to create the outer encapsulation 1338, thus reducing process complexity and cost.

Figure 14:
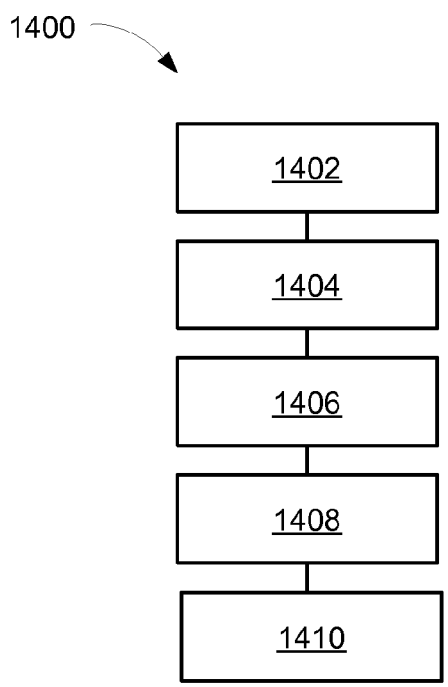
FIG. 14 is a flow chart of an integrated circuit package system for manufacturing the integrated circuit package system of FIG. 1 in an embodiment of the present invention.

Referring now to FIG. 14, therein is shown a flow chart of an integrated circuit package system 1400 for manufacturing the integrated circuit package system 100 of FIG. 1 in an embodiment of the present invention. The system 1400 includes providing a substrate in a block 1402; mounting a first package above the substrate, the first package having a mold cavity exposing an exposed portion on a first integrated circuit from a first package encapsulation in a block 1404; in a block 1406; mounting a second package above the first package and attached to the exposed portion of the first integrated circuit; mounting a structure above the second package and connected to the substrate around the first package in a block 1408; and encapsulating the first package and the second package with an outer encapsulation having a completely planar top or a planar top co-planar to a top surface of the structure in a block 1410.

A principle aspect that has been discovered is that the planar top of the present invention allows for a streamlined encapsulation that does not require a "top chase" dedicated to create an outer encapsulation, thus reducing process complexity and cost.

Another aspect is that the mold cavity reduces total package height by allowing a second package to be mounted directly to the first integrated circuit.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the planar encapsulation and mold cavity system of the present invention furnishes important and heretofore unknown and unavailable solutions, capabilities, and functional aspects for package in package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
providing a substrate;
mounting a first package above the substrate, the first package having a first package encapsulation with a mold cavity exposing an exposed portion on a first integrated circuit from the first package encapsulation;
providing a lead frame or a flexible interposer above the first package;
mounting a second package above the first package on the underside of the lead frame or the flexible interposer, the second package attached to the exposed portion of the first integrated circuit in the mold cavity; and
encapsulating the first package and the second package with an outer encapsulation, the outer encapsulation is parallel to the substrate and co-planar with the lead frame or the flexible interposer.

2. The system as claimed in claim 1 wherein:
providing the lead frame or the flexible interposer includes connecting the lead frame or the flexible interposer to the substrate around the first package.

3. The system as claimed in claim 1 wherein:
mounting the second package includes mounting the second package having a second package encapsulation encapsulating the second integrated circuit.

4. The system as claimed in claim 1 wherein:
encapsulating the second package includes encapsulating with the outer encapsulation having a completely planar top or a planar top co-planar to a top surface of the lead frame or the flexible interposer.

5. The system as claimed in claim 1 wherein:
providing the lead frame or the flexible interposer includes connecting the lead frame or the flexible interposer to the substrate with direct contact.

6. An integrated circuit package system comprising:
providing a substrate;
mounting a first package above the substrate, the first package having a first package encapsulation with a mold cavity exposing an exposed portion on a first integrated circuit from the first package encapsulation;
providing a lead flame or a flexible interposer above the first package;
mounting a second package above the first package on the underside of the lead flame or the flexible interposer, the second package attached to the exposed portion of the first integrated circuit in the mold cavity;
attaching the second package to the first package with a die attach adhesive;
mounting a third package over the second package; and
encapsulating the first package and the second package with an outer encapsulation, the outer encapsulation is parallel to the substrate and co-planar with the lead frame or the flexible interposer.

7. The system as claimed in claim 6 wherein:
mounting the second package includes having the mold cavity offset to a side of the first integrated circuit.

8. The system as claimed in claim 6 wherein encapsulating includes encapsulating between the first package and the second package.

9. The system as claimed in claim 6 further comprising:
mounting passive components to the lead frame or the flexible interposer.

10. An integrated circuit package system comprising:
a substrate;
a first package mounted above the substrate, the first package including: a first integrated circuit having a side, and a first package encapsulation having a mold cavity exposing the first integrated circuit;
a lead frame or a flexible interposer above the first package;
a second package mounted above the first package on the underside of the lead frame or the flexible interposer, the second package attached to the exposed portion of the first integrated circuit in the mold cavity; and
an outer encapsulation encapsulating the first package and the second package with an outer encapsulation, the outer encapsulation is parallel to the substrate and co-planar with the lead frame or the flexible interposer.

11. The system as claimed in claim 10 wherein:
the lead frame or flexible interposer is connected to the substrate around the first package.

12. The system as claimed in claim 10 further comprising:
a second package encapsulation encapsulating the second integrated circuit.

13. The system as claimed in claim 10 wherein:
the lead frame or the flexible interposer has a top surface; and
the outer encapsulation has a completely planar top or a planar top co-planar to the top surface of the lead frame or the flexible interposer.

14. The system as claimed in claim 10 wherein the lead frame or the flexible interposer is in direct contact with the substrate around the first package.

15. The system as claimed in claim 10 further comprising:
a third package mounted above the second package; and
a die attach adhesive attaching the second package to the first package.

16. The system as claimed in claim 15 wherein:
the mold cavity is offset to the side of the first integrated circuit.

17. The system as claimed in claim 15 wherein the outer encapsulation is between the first package and the lead frame or the flexible interposer.

18. The system as claimed in claim 15 further comprising:
passive components mounted to the lead frame or the flexible interposer.

* * * * *

UNITED STATES PATENT AND TRADEMARK OFFICE
CERTIFICATE OF CORRECTION

PATENT NO. : 8,531,043 B2  
APPLICATION NO. : 12/236445  
DATED : September 10, 2013  
INVENTOR(S) : Ha et al.

Page 1 of 1

It is certified that error appears in the above-identified patent and that said Letters Patent is hereby corrected as shown below:

In the Claims:

Column 14, Claim 6, line 55, delete "flame" and insert therefor --frame--

Column 14, Claim 6, line 58, delete "flame" and insert therefor --frame--

Signed and Sealed this  
Tenth Day of May, 2016

Michelle K. Lee  
*Director of the United States Patent and Trademark Office*